(12) United States Patent
Bestwick

(10) Patent No.: US 6,678,157 B1
(45) Date of Patent: Jan. 13, 2004

(54) ELECTRONICS ASSEMBLY WITH COOLING ARRANGEMENT

(75) Inventor: Graham Spencer Bestwick, Newbury (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/245,234

(22) Filed: Sep. 17, 2002

(51) Int. Cl.[7] ............................................. H05K 7/20
(52) U.S. Cl. .................. 361/695; 361/690; 361/694; 174/16.1; 165/104.34; 165/122; 454/184
(58) Field of Search ................. 361/690–692, 361/694, 695, 719, 720; 174/16.1, 16.3; 165/80.3, 104.33, 122; 454/184

(56) References Cited

U.S. PATENT DOCUMENTS 5,828,549 A * 10/1998 Gandre et al. ............... 361/695
5,936,836 A   8/1999 Scholder
5,963,424 A * 10/1999 Hileman et al. ............. 361/695
6,031,720 A *  2/2000 Crane et al. ................. 361/695
6,094,346 A   7/2000 Schweers et al.
6,169,656 B1  1/2001 Pei et al.
6,236,565 B1 *  5/2001 Gordon ....................... 361/695
6,244,953 B1 *  6/2001 Dugan et al. ................ 454/184
6,364,009 B1 *  4/2002 MacManus et al. ......... 165/185
6,452,797 B1 *  9/2002 Konstad ....................... 361/695

FOREIGN PATENT DOCUMENTS

JP          03268483 A  * 11/1991  ............. H05K/7/20

* cited by examiner

*Primary Examiner*—Boris Chervinsky
(74) *Attorney, Agent, or Firm*—Meyertons Hood Kivlin Kowert & Goetzel, P.C.; B. Noël Kivlin (57) ABSTRACT

An electronics assembly, for example a computer, comprises an enclosure, and a heat-generating component located within the enclosure. A duct extends from the region of an aperture in a wall of the enclosure to the component and a fan is located within the duct to cause a flow of air from outside the enclosure directly to the heat-generating component.

14 Claims, 6 Drawing Sheets

ELECTRONICS ASSEMBLY WITH COOLING ARRANGEMENT

BACKGROUND OF THE INVENTION

This invention relates to electronics assemblies, for example to computer systems, and to thermal management thereof.

Certain systems may be employed as servers, for example in local area networks (LANS), or in wide area networks (WANs), telecommunications systems or other operations such as database management or as internet servers. Such servers may be used in so-called "horizontally scaled" applications in which tens or hundreds of corresponding servers are employed as part of a distributed system.

A typical computer employed for such purposes will comprise one or more processors mounted on a circuit board, together with other components such as power supply units (PSUs), hard disc drives (HDDS), fans, digital video disc (DVD) players, memory modules, ethernet ports etc. The servers may be designed in modular form so that they can be stacked together with other corresponding servers in large racks. For example, many low end servers may be designed with a modular height of one or more 44.5 mm (1¾ inch) high units.

It can often be a problem to ensure that such systems are cooled adequately in view of the relatively large number of electronics components in an enclosed environment. The assembly enclosure may be provided with one or more enclosure fans in one of the assembly walls which provide a flow of air through the assembly. In addition, various components such as microprocessors and the like that generate large quantities of heat may require their own fans. In such a case, microprocessors are conventionally provided with so-called "impingement" fans that are placed on, and attached to, the component, or on a heat-sink that is attached to the component. The fan will therefore be mounted only a few millimetres away from the component and will blow air from the enclosure down directly onto the component or onto the heat-sink.

However, as microprocessors have become more powerful, and therefore generate larger quantities of heat, it has been difficult to ensure adequate cooling of the microprocessor, even with the use of an impingement fan. In addition, the servers may not always be employed in data centres with air conditioned environments, and ambient temperatures may therefore be relatively high. For example, the Network Equipment-Building Standard (NEBS), which forms the requirement laid down by Telcordia Technologies (formerly Bellcore), requires that such a system will operate at ambient temperatures of up to about 55° C. without the junction temperature of the components exceeding about 85° C.

SUMMARY OF THE INVENTION

According to one aspect of the present invention, there is provided an electronics assembly which comprises:
(i) an enclosure;
(ii) a heat-generating component located within the enclosure;
(iii) a duct that extends from the region of an aperture in a wall of the enclosure to the component; and
(iv) a fan that is located within the duct to cause a flow of air from outside the enclosure directly to the heat-generating component.

This form of assembly has the advantage that the efficiency of thermal management of the enclosure can be significantly improved. This is partly due to the fact that air for cooling the hottest components such as microprocessors is taken directly from the exterior of the enclosure rather than from within it where the temperature can be typically 10° C. higher than outside, and also because air is not blown directly onto the component or onto the heat-sink in a direction normal to the plane of the component, thereby causing vortices within the enclosure and consequent hot spots. Instead, air can be blown in a direction generally parallel to the surface of the component and the circuit board.

The duct may be designed so that air is caused to flow from outside the enclosure to the component with substantially no mixing thereof with air in the rest of the enclosure, at least until after the air has passed the heat-generating component, thereby ensuring that the air has not been heated up by the other components before it is used to cool the heat-generating component. There will, in general, be some degree of mixing of the air in the duct and in the remainder of the enclosure since the duct is not designed to be air tight, but, by use of the duct it is possible to reduce the mixing of air to the extent that the temperature of the air that is blown onto the component is closer to that of the ambient air outside the enclosure than to that of the air in the remainder of the enclosure.

The heat generating component may be mounted on a generally planar circuit board, for example it may be surface mounted or mounted in a dual in line I.C. package and the duct may cause the cooling air to flow in a direction generally parallel to the circuit board, in contrast with conventional impingement fans. For example, where a heat sink is provided on the component, it may be provided with cooling fins that extend outwardly from the surface of the component, and the duct may cause the air to flow between the fins and parallel to the surface of the component, so that there is relatively little disturbance to the flow of the air by the component or the heat sink, as compared with the case of an impingement fan.

According to one aspect of the invention, the duct is formed in a plurality of parts, and different parts of the duct are attached to different parts of the enclosure. For example, if the parts of the duct are joined together along the axis of the duct, and one part of the duct is attached to a lid of the enclosure, then the duct will automatically be opened when access to the duct is obtained by opening the lid, thereby facilitating access to the fan for the purposes of replacement.

According to another aspect of the invention, there is provided a method of cooling a heat-generating component in an electronics assembly, which comprises:
(i) providing a duct that extends from the region of a wall of the enclosure to the heat-generating component; and
(ii) causing air to flow along the duct from outside the enclosure to the heat-generating component.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
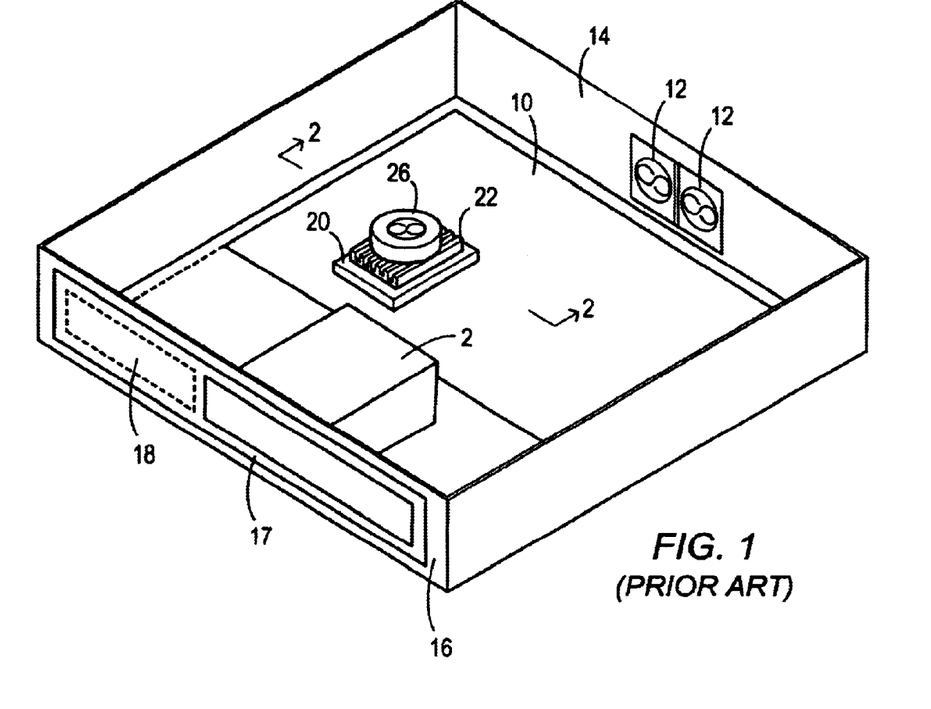
FIG. 1 is a schematic perspective view of a conventional electronics assembly forming a network server.

Referring now to the drawings, in which like reference numerals are used to designate corresponding elements, FIG. 1 is a schematic perspective view of part of a conventional narrow form factor computer that is intended to provide a rack mounted server for use with the internet or as part of a local area network (LAN) or for other telecommunications purposes, and is designed to fit into, for example a nineteen inch rack electronics cabinet. Other sizes may alternatively be employed, for example to fit into 23 inch or metric racks. The assembly may be designed to be a so-called "high RAS" system, that is to say, to have high reliability, availability and serviceability, so that it will be operated with the minimum amount of down time, although for other systems different criteria such as cost may be more important.

The computer may comprise a generally flat, rectangular enclosure 1 that contains a number of components, for example a hard disc drive 2, a power supply unit (PSU) and the like. The majority of the components in the enclosure are not shown for the sake of clarity. The enclosure also contains a printed circuit board (pcb) 10 on which a number of additional electronic components such as memory integrated circuits (ICs) and general passive devices such as resistors and capacitors may be located. In order to remove heat that is generated by operation of the components of the assembly, one or more enclosure fans 12 (two in this case) may be mounted in one of the walls of the enclosure 1, for example the rear wall 14. The opposite wall 16, which includes the front bezel 17 of the assembly, may be provided with one or more apertures 18, which may, for example, be obscured behind the bezel, in order to allow entry of air so that the fans 12 may create a through flow of air.

Figure 2:
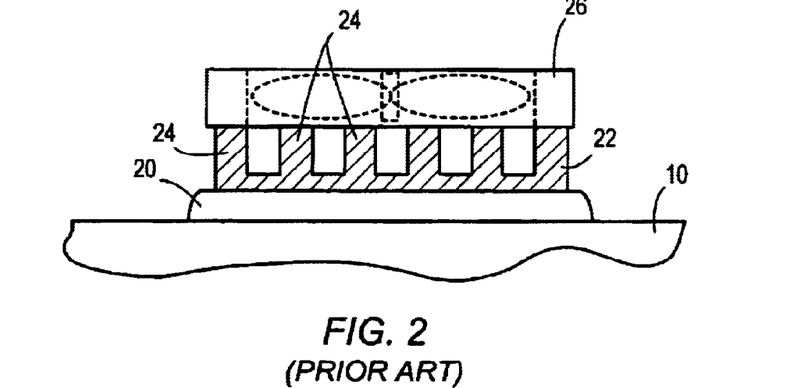
FIG. 2 is a section through a microprocessor used in the assembly of FIG. 1 together with associated heat sink and impingement fan.

The enclosure fans 12 will usually be sufficient to enable adequate cooling of most of the components of the assembly, but some components generate more heat than others and have specific cooling requirements. For example, a microprocessor 20 may be located on the pcb 10. Microprocessors by their nature, may generate relatively large quantities of heat, and so a heat sink 22, as shown in FIG. 2, may be located on the microprocessor 20 so that it is in thermal contact therewith. A typical heat sink may be formed from a body of metal, for example aluminium, copper or steel, that is provided with a number of fins 24 to increase the surface area of the body. In addition, a separate fan 26, known as an impingement fan, may be attached to the upper surface of the heat sink, in order to blow air directly onto the heat sink.

Such impingement fans 26 can significantly improve cooling of heat generating components such as microprocessors, but even so, they may not be able to provide a sufficient degree of cooling in some circumstances. In particular, where more powerful microprocessors have been used to replace existing microprocessors in standard enclosures, cooling of the microprocessor by means of an impingement fan may not be adequate to maintain the temperature within the microprocessor at acceptable levels. For example, while such systems will normally operate in environments where the ambient temperature is in the order of 20° C., the NEBS standard may require the system to function at ambient temperatures up to about 55° C. However, the junction temperature $T_j$ of the microprocessor IC should not exceed about 85° C. or thermal damage may result.

Figure 3:
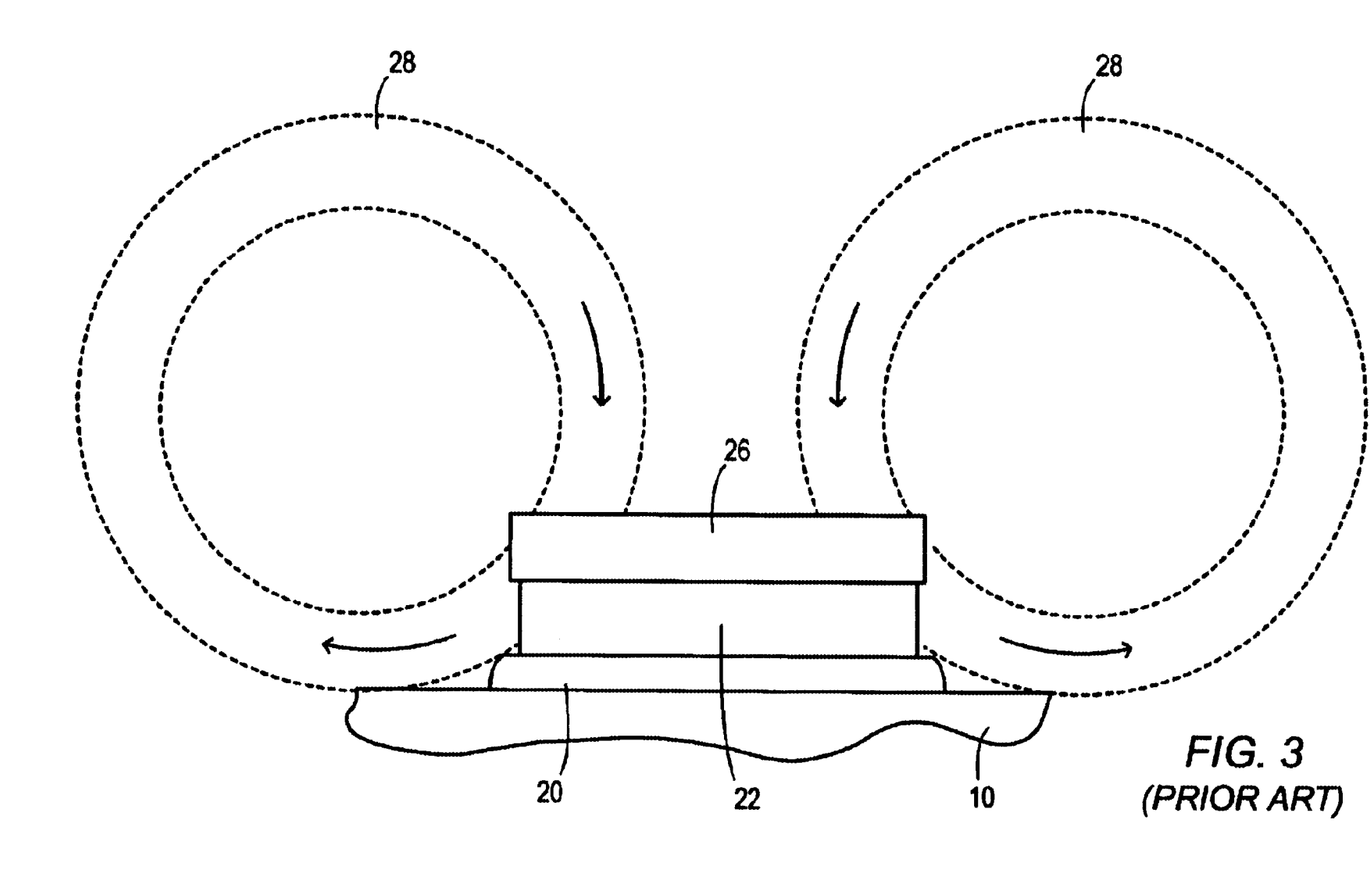
FIG. 3 is a side elevation of the microprocessor, heat sink and fan of FIG. 2 taken from another angle indicating air flow around the fan.

Part of the problem of cooling the components using an impingement fan is that the cooling air in the enclosure is normally somewhat higher than the external ambient temperature, for example in the order of 10° C. higher. In addition, as shown in FIG. 3, which is an elevation of the microprocessor 20, heat sink 22 and impingement fan 26 taken from the side, the fact that the impingement fan 26 blows air directly onto the heat sink in a direction normal to the major surface of the microprocessor 20, can generate vortices 28 in the air flow in the enclosure. These vortices may reduce the effectiveness of the impingement fan 26 by causing air that has previously been heated by the microprocessor to be recirculated into the fan 26. This problem may be exacerbated where the enclosure is designed to be relatively shallow, for example in the case of enclosures having a single (44.5 mm) modular height unit.

Figure 4:
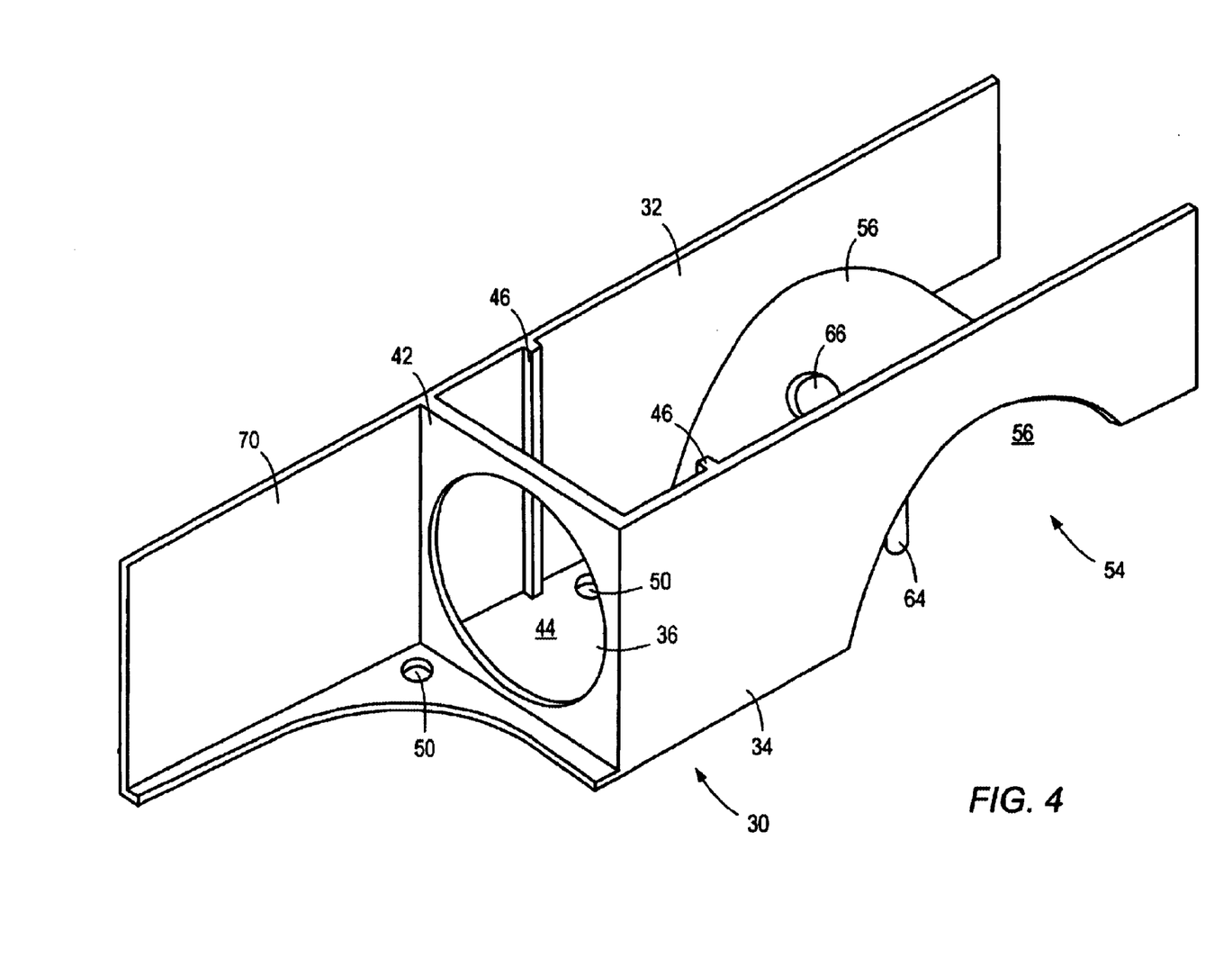
FIG. 4 is an isometric view of part of a duct employed in the present invention.
Figure 5:
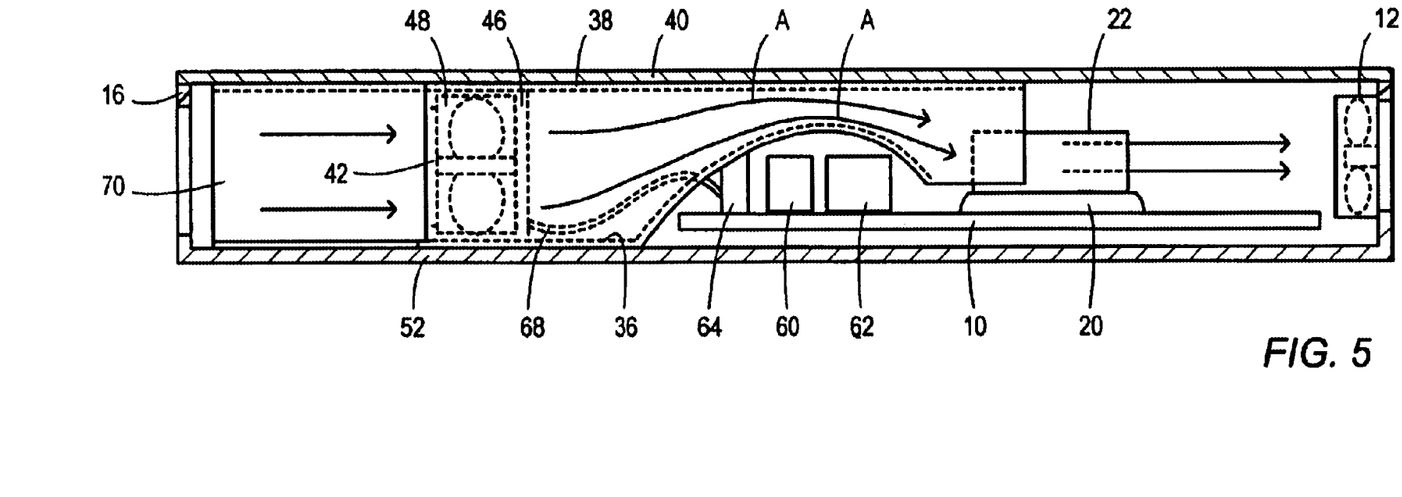
FIG. 5 is a sectional elevation through part of an electronics assembly employing the duct of FIG. 4.

FIG. 4 shows a moulding 30 that forms part of a duct that is employed in an assembly according to one aspect of the invention, and FIG. 5 is a side view of the duct within the enclosure. The duct may be formed from plastics, and may have a generally rectangular cross-section. The moulding 30 has a first side wall 32, a second side wall 34 and a lower wall 36. An upper wall 38 of the duct as shown in FIG. 5 may be formed separately from the moulding so that the moulding 30 and the upper wall 38 form parts of the duct that are separated along the axis of the duct. The upper wall 38 may remain as a separate piece that is attached to the moulding 30, or it may be attached to a lid 40 of the enclosure. Alternatively, if desired, a separate plastics upper wall 38 may be dispensed with altogether so that the upper wall of the duct is provided by the lid 40 of the enclosure.

The moulding includes a transverse bulkhead 42 in a central region thereof having a large circular aperture 44 therein, and a pair of internal ribs 46 that extend across the side walls 32 and 34 to the rear of the bulkhead 42. The bulkhead 42 and the ribs 46 together form surfaces for receiving and locating a fan 48 that can be positioned therebetween, for example by sliding it transversely between the ribs and bulkhead. The aperture 44 may be dimensioned in accordance with the fan that is intended to be positioned in the duct in order to allow as large an air flow as possible through the duct given the size of the fan.

The lower surface 36 of the moulding may have a number of screw holes 50 for enabling it to be secured to a lower horizontal wall or base 52 of the housing or to a pcb. The moulding also has a rear end region 54 where the lower wall 36 of the moulding rises up to form an arch 56. That part of the moulding 30 to the rear of the arch 56 need not extend to the same level as the lower wall 36 forward of the arch, but may remain at an elevated position (when in position within the enclosure) in order to allow space for the pcb 10 to extend between the duct and the lower horizontal wall 52 of the enclosure. The arch 56 is formed in the moulding according to this embodiment of the invention in order to allow the duct to extend over components such as capacitors 60 and 62 that are located on the circuit board 10 in front of the microprocessor 20. In alternative embodiments of the invention, where the layout of the circuit board is such as to render it unnecessary, the arch 56 may be dispensed with. Extending from the lower wall 36 in the region of the arch 56 is located a stand-off 64 in the form of a post that may engage a hole in the circuit board in order to increase stability of the moulding within the enclosure. In addition, a small aperture 66 may be provided in the lower wall in the region of the arch 56 in order to allow power cables 68 for the fan 48 to extend into the duct.

When the moulding 30 is located within the enclosure as shown in FIG. 5, the front end 70 thereof may be located in the region of the wall 16 containing the front bezel of the enclosure and in line with an aperture 18 therein so that the fan 48 can suck ambient air into the duct from outside the enclosure rather than from within the enclosure. The cooling air then flows along the duct in the direction of the arrows A until it reaches the microprocessor 20 and heat sink 22. The heat sink may be oriented so that the fins 24 thereof are arranged in parallel with the airflow in order to reduce the possibility of any quiescent regions of air around the heat sink. In this way, cooling air for the microprocessor may be taken directly from the exterior of the electronics enclosure. The duct could, in principle, extend beyond the microprocessor and the air be led out of the enclosure, but this is not necessary since the microprocessor will be cooled by air from the exterior of the enclosure even where, as shown in FIG. 5, the duct extends only as far as the microprocessor. Air from the duct can then be used to cool other components in the enclosure before being expelled by the enclosure fans.

As shown in FIGS. 4 and 5, the duct may be formed from a number of parts, for example from the moulding 34 and the upper wall 38. The parts of the duct may, for example, be assembled together to form a duct assembly before the assembly is installed in the housing, or alternatively different parts of the duct may be attached to different parts of the enclosure or to different units, such as disc drives or power supply units, within the enclosure. Indeed, the parts from which the duct is formed need not be employed exclusively to form the duct, but may instead also provide other functions. For example, the upper wall of the duct could, if desired, be formed from the lid of the enclosure. In addition or alternatively, the lower wall of the duct or part thereof could be formed from the lower wall 52 of the enclosure. As shown in FIG. 4, only the side wall 32 extends in front of the bulkhead 42 to the wall 16 of the enclosure. In this region, the lower wall is provided by the base 52 of the enclosure while the side of the duct opposite the wall 32 in the front region may be formed by other components such as the side of the hard disc drive 2.

Figure 6:
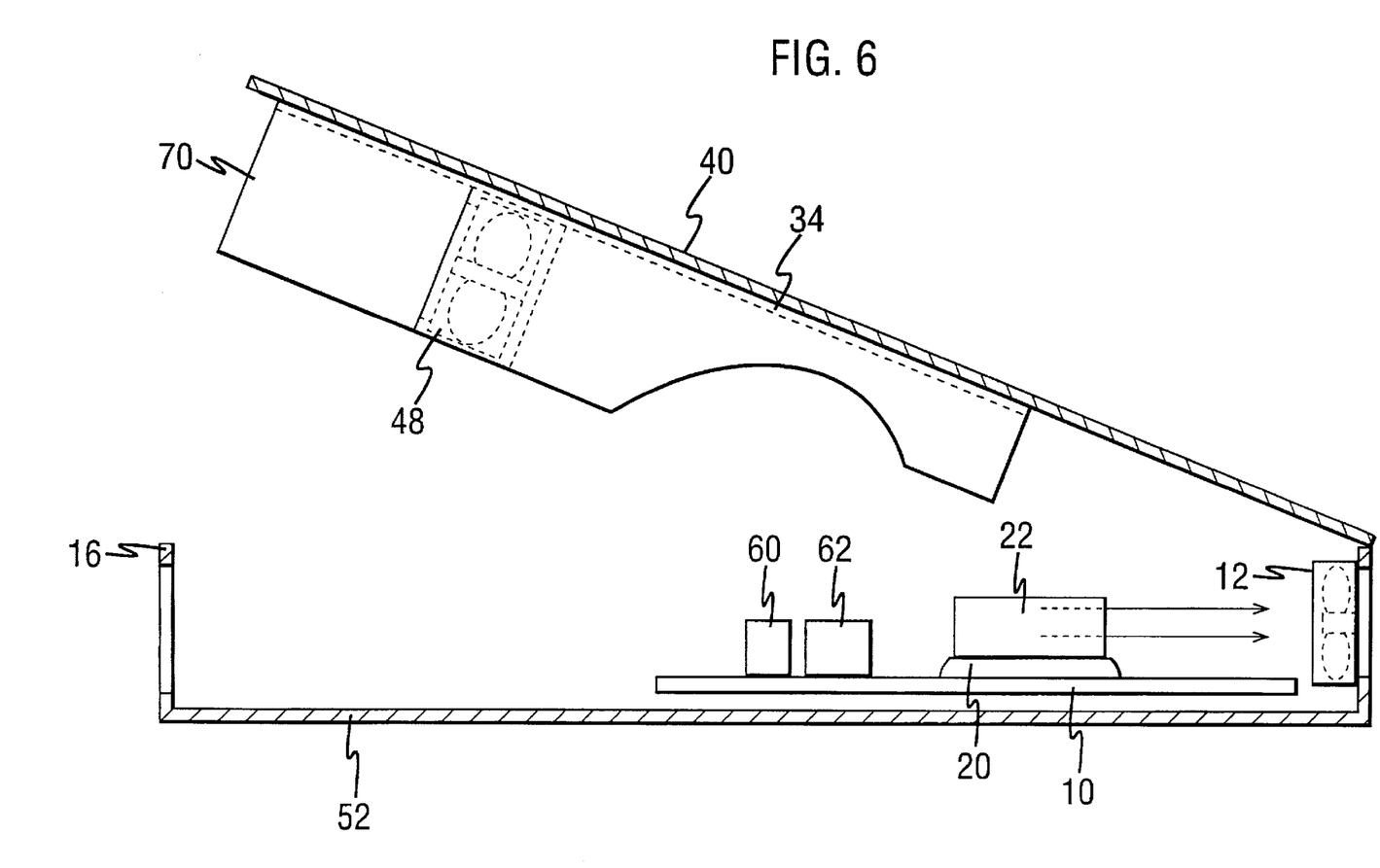
FIG. 6 is a sectional elevation through part of an electronics assembly according to another aspect of the invention.

FIG. 6 shows an enclosure in accordance with another embodiment of the invention. This form of enclosure is similar to that shown in FIG. 5, but the moulding forming the duct is attached to the lid 40 of the enclosure. The moulding differs slightly from that shown in FIG. 4, for example by removing the lower wall 36 to enable the fan 48 to be inserted and removed from beneath, and because the lower wall of the duct in this region will be provided by the base 52 of the enclosure. This form of assembly has the advantage that the duct moves out of the way together with the lid 40 when the enclosure is opened to allow access to the circuit board 10 and to other components. This allows the circuit board to be employed as a field replaceable unit for maintenance purposes.

As described, the duct is in the form of a plastics moulding. The duct may, however, be formed from any appropriate material that will not generate dust or fibrous material entrained in the air flow, for example metal e.g. aluminium or steel.

Figure 7:
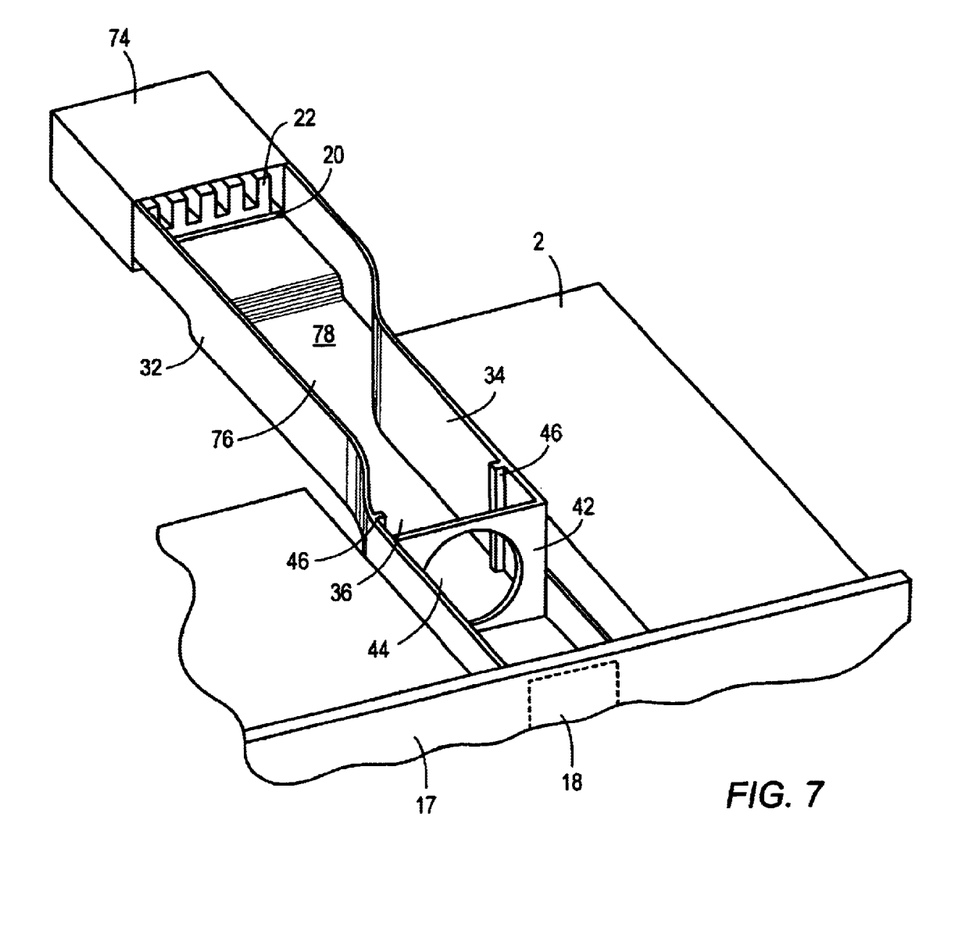
FIG. 7 is a perspective view of part of an electronics assembly showing an alternative form of duct.

FIG. 7 shows another form of duct for use in an assembly. This form of duct is generally the same as that shown in FIGS. 4 and 5 having a pair of side walls 32 and 34, a lower wall 36 and a transverse bulkhead 42 with ribs 46 for receiving a fan that can be inserted from above. The front end 70 of side wall 32 may extend beyond the front of the transverse bulkhead 42 while the opposite side wall 34 may stop at the bulkhead the side of the duct in this region being provided by a side of hard disc drive 2. The duct extends from the front bezel 17 where air can enter via entry 18 to the heat operating component 20 and associated heat-sink 22. The component 20 and heat-sink 22 may be enclosed on three sides by a cover 74 in order to ensure that air from the duct flows over and in contact with the heat-sink 22. The lower wall 36 may be raised in region 56 in order to accommodate other components located on the circuit board.

In this form of duct, the duct may have a width that varies along its length in order to accommodate components of the assembly. For example the duct may be relatively narrow in a forward region 76 thereof in order to allow for the presence of the hard disc drive 2, and then widen out in a rearward region 78 behind the hard disc drive 2 so that it extends across the full width of the component 20 and heat sink 22.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An electronics assembly which comprises:
   (i) an enclosure having a removable lid;
   (ii) a heat generating component located within the enclosure;
   (iii) a duct that extends from the region of an aperture in a wall of the enclosure to the component, a part of the duct being attached to, or being formed by, the lid of the enclosure; and
   (iv) a fan that is located within the duct to cause a flow of air from outside the enclosure directly to the heat generating component;
   wherein the duct has a plurality of guides to allow insertion and removal of the fan in a direction transverse to the duct.

2. An assembly as claimed in claim 1, wherein the duct causes air to flow from outside the enclosure to the component with substantially no mixing thereof with air in the rest of the enclosure, at least until after it has passed the heat generating component.

3. An assembly as claimed in claim 1, wherein the heat generating component is mounted on a generally planar circuit board, and the duct causes air to flow in a direction generally parallel to the circuit board.

4. An assembly as claimed in claim 1, wherein the heat generating component includes a heat sink, and the duct causes air to flow over the heat sink.

5. An assembly as claimed in claim 4, wherein the heat sink has fins that extend in a direction away from a surface of the component, and the duct causes air to flow between the fins and in a direction parallel to the surface of the component.

6. An assembly as claimed in claim 1, wherein the duct extends from a first side wall of the enclosure toward an opposite side wall, and one or more enclosure fans are located in the opposite side wall of the enclosure.

7. An assembly as claimed in claim 1, wherein the fan has a body and the duct has a bore that is substantially filled by the body of the fan.

8. An assembly as claimed in claim 1, wherein different parts of the duct are joined together along an axis of the duct.

9. An assembly as claimed in claim 1, wherein a part of the duct is located on a circuit board of the assembly, and a portion of the duct is raised off the circuit board.

10. An assembly as claimed in claim 1, wherein the enclosure has a generally flat shape to allow it to be stacked with one or more other such enclosures while allowing access to one or more side walls thereof.

11. An assembly as claimed in claim 1, wherein the heat generating component is a microprocessor.

12. A method of cooling a heat generating component in an electronics assembly enclosure, which comprises:

(i) providing a duct that extends from an aperture in a wall of the enclosure to the heat generating component, wherein a part of the duct is attached to, or is formed by, a lid of the enclosure; and (ii) causing air to flow along the duct from outside the enclosure to the heat generating component using a fan inserted into the duct having a plurality of guides in the duct to allow insertion and removal of the fan in a direction transverse to the duct.

13. A method as claimed in claim 12, wherein the heat generating component is located on a circuit board in the enclosure, and the air is caused to flow in a direction generally parallel to the plane of the circuit board.

14. A method as claimed in claim 12, wherein the air is caused to flow along the duct by means of a fan that is located within the duct.

* * * * *